(12) United States Patent
Shimizu

(10) Patent No.: US 7,272,187 B2
(45) Date of Patent: Sep. 18, 2007

(54) FILTER CIRCUIT AND RADIO APPARATUS

(75) Inventor: Yoshito Shimizu, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 347 days.

(21) Appl. No.: 10/513,792

(22) PCT Filed: Nov. 4, 2003

(86) PCT No.: PCT/JP03/14050

§ 371 (c)(1),
(2), (4) Date: Nov. 17, 2004

(87) PCT Pub. No.: WO2004/040755

PCT Pub. Date: May 13, 2004

(65) Prior Publication Data

US 2005/0220195 A1 Oct. 6, 2005

(30) Foreign Application Priority Data

Nov. 1, 2002 (JP) ............................ 2002-319745
May 29, 2003 (JP) ............................ 2003-152532

(51) Int. Cl.
*H04B 3/00* (2006.01)

(52) U.S. Cl. ...................... 375/257; 375/147; 375/344; 375/351; 333/18

(58) Field of Classification Search ................... None
See application file for complete search history.

(56) References Cited

U.S. PATENT DOCUMENTS

| | | | | |
|---|---|---|---|---|
| 4,333,063 A * | 6/1982 | Ryu et al. ...................... 333/18 |
| 5,029,181 A * | 7/1991 | Endo et al. ................. 375/147 |
| 5,179,593 A * | 1/1993 | Sakata .......................... 381/3 |
| 5,548,619 A * | 8/1996 | Horiike et al. .............. 375/344 |
| 5,654,550 A * | 8/1997 | Nomura et al. .......... 250/338.3 |
| 6,393,259 B1 * | 5/2002 | Kusunoki .................... 455/78 |
| 6,463,295 B1 * | 10/2002 | Yun ........................... 455/522 |
| 7,035,592 B1 * | 4/2006 | Doi et al. ................. 455/67.11 |
| 2002/0158691 A1 * | 10/2002 | Blankenship et al. ....... 330/253 |

(Continued)

FOREIGN PATENT DOCUMENTS

JP     57-069317     4/1982

(Continued)

OTHER PUBLICATIONS

English Language Abstract of JP 6-152318.

(Continued)

*Primary Examiner*—David C. Payne
*Assistant Examiner*—Leon-Viet Q Nguyen
(74) *Attorney, Agent, or Firm*—Greenblum & Bernstein, P.L.C.

(57) ABSTRACT

A distributor 103 distributes an input signal into two lines of distributed signals with equal amplitudes and equal phases. Buffers 104, 105 suppress interference between distributed signals distributed into the two lines. A filter 106 performs a frequency selection which allows only a distributed signal in a predetermined band to pass. A differential amplifier 107 outputs a difference in amplitude components between a distributed signal frequency-selected by the filter 106 and the distributed signal which is not frequency-selected. This allows an attenuation characteristic or passage characteristic in a high-frequency band to be maintained.

12 Claims, 12 Drawing Sheets

U.S. PATENT DOCUMENTS

2002/0181439 A1* 12/2002 Orihashi et al. ............ 370/350
2003/0123526 A1* 7/2003 Howard et al. ............. 375/147

FOREIGN PATENT DOCUMENTS

| | | |
|---|---|---|
| JP | 61-230536 | 10/1986 |
| JP | 5-080040 | 10/1993 |
| JP | 6-152318 | 5/1994 |
| JP | 10-084250 | 3/1998 |
| JP | 10-084250 A * | 3/1998 |
| JP | 2001-045336 | 2/2001 |
| JP | 2001-211098 | 8/2001 |

OTHER PUBLICATIONS

English Language Abstract of JP 2001-211098.
English Language Abstract of JP 61-230536.
English Language Abstract of JP 10-084250.
English Language Abstract of JP2001-045336.

* cited by examiner

FILTER CIRCUIT AND RADIO APPARATUS

TECHNICAL FIELD

The present invention relates to a filter circuit and radio apparatus, and more specifically, to a filter circuit and radio apparatus for a high-frequency band used for a digital radio communication system, for example.

BACKGROUND ART

Some conventional filter circuits using an amplifier realize a filter characteristic using conductance of the amplifier and capacitance. According to this filter circuit, a positive-phase input terminal of a first conductance amplifier, which constitutes an active filter, is connected to a first input terminal via first resistor and connected to a ground point via second resistor. Furthermore, a negative-phase input terminal of the first conductance amplifier is connected to a second input terminal via third resistor and connected to an external output terminal via fourth resistor. Then, the resistance value ratio between the first resistor and second resistor is equalized to the resistance value ratio between the third resistor and fourth resistor and one signal including an in-phase signal component is added to the first input terminal and the other signal is added to the second input terminal. In this way, the conventional filter circuit adopts a multi-stage structure with each stage consisting of a capacitance and conductance amplifier, and can thereby obtain a steep attenuation characteristic.

However, the conventional filter circuit and radio apparatus realize nothing more than a filter in a low pass type configuration, and realizing a band pass type configuration in a high-frequency band requires a combination of a low pass type configuration and high pass type configuration, and furthermore, obtaining a steep attenuation characteristic requires a multi-stage configuration, and there are problems that the number of capacitances and conductance amplifiers increase and the size of the circuit increases, making integration of the circuit difficult. On the other hand, reducing the number of stages of the filter circuit to reduce the amount of attenuation of a desired frequency component without increasing the size of the circuit results in a problem that it is difficult to realize a steep attenuation characteristic or passage characteristic in a high frequency band.

DISCLOSURE OF INVENTION

It is an object of the present invention to provide a filter circuit and radio apparatus capable of maintaining an attenuation characteristic or passage characteristic in a high-frequency band using an in-phase elimination effect of a differential amplifier.

This object can be attained by distributing an input signal into two lines of distributed signals, applying a frequency selection to one of the distributed signals and outputting a difference in amplitude components between the one frequency-selected distributed signal and the other not frequency-selected distributed signal.

BEST MODE FOR CARRYING OUT THE INVENTION

With reference now to the attached drawings, embodiments of the present invention will be explained below.

EMBODIMENT 1

Figure 1:
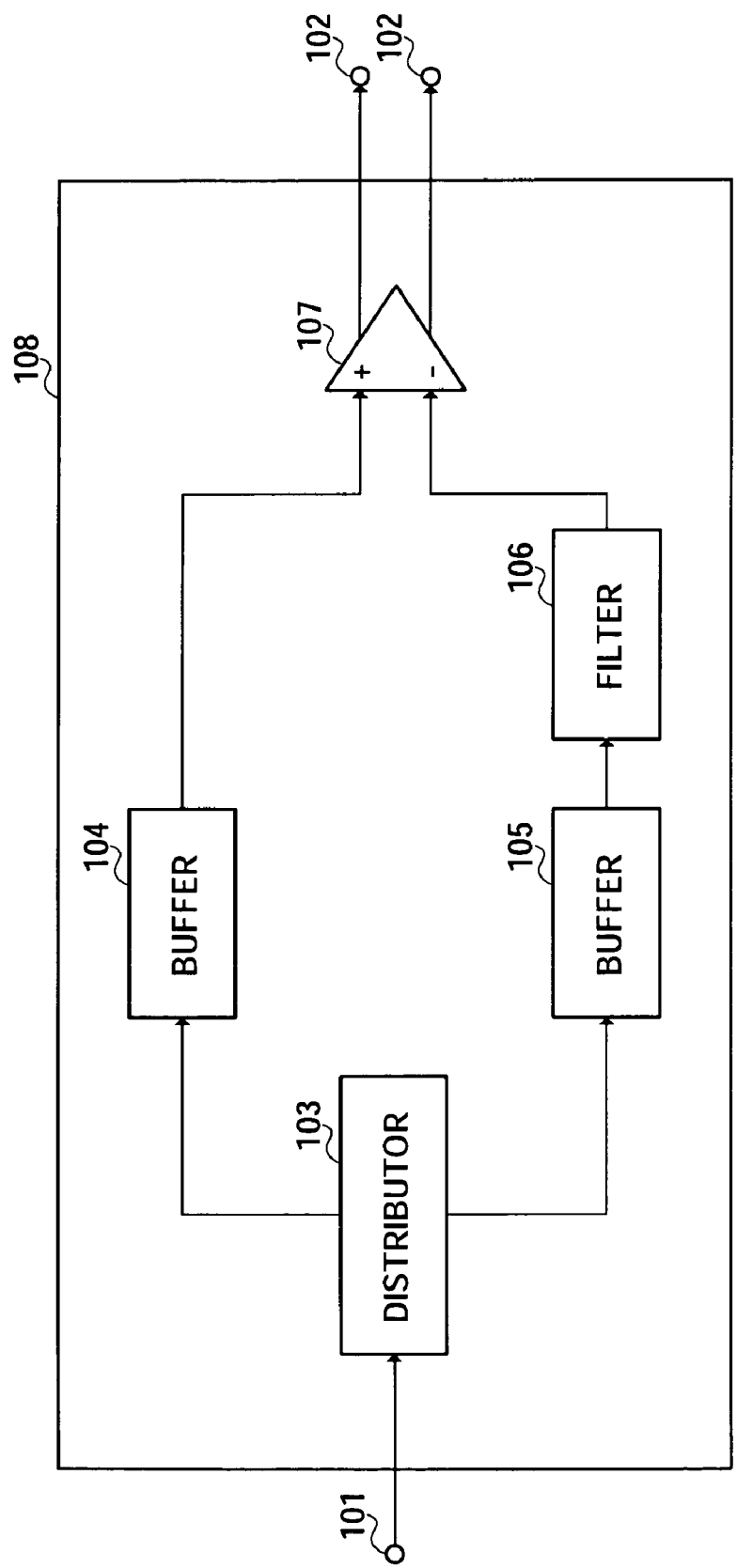
FIG. 1 is a block diagram showing a configuration of a filter circuit according to Embodiment 1 of the present invention.

FIG. 1 is a block diagram showing a configuration of a filter circuit 108 according to Embodiment 1 of the present invention.

A signal input terminal 101 in FIG. 1 receives an input signal and sends it to a distributor 103. Signal output terminals 102 output output signals from a differential amplifier 107. The distributor 103 distributes a signal in an arbitrary frequency band input from the signal input terminal 101 into two lines of distributed signals of the equal amplitude and equal phase and outputs the respective distributed signals to a buffer 104 and a buffer 105. The buffer 104 suppresses interference between the two lines of distributed signals input from the distributor 103 and outputs the signal to the differential amplifier 107. The buffer 105 suppresses interference between the two lines of distributed signals input from the distributor 103 and outputs the signal to the filter 106. The filter 106 applies a frequency selection to the distributed signal input from the buffer 105 and output the frequency-selected signal to the differential amplifier 107.

The differential amplifier 107 outputs a difference in amplitude components between the distributed signal input from the buffer 104 to a non-inverted input terminal and the distributed signal input from the filter 106 to an inverted input terminal to the signal output terminals 102.

The operation of the filter circuit 108 in the above described configuration will be explained using FIG. 2 to FIG. 6.

First, a case where the attenuation characteristic of the filter 106 is of a low pass type, high pass type or band pass type will be explained.

Figure 2:
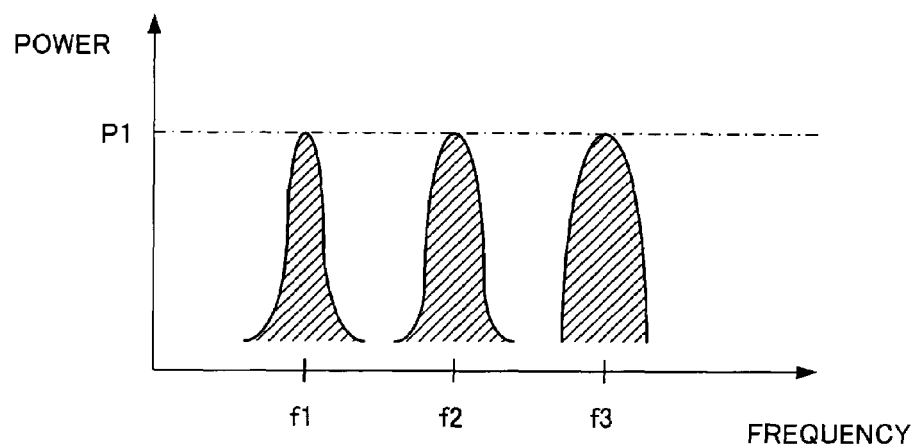
FIG. 2 illustrates a power-frequency relationship of a signal according to Embodiment 1 of the present invention.
Figure 3:
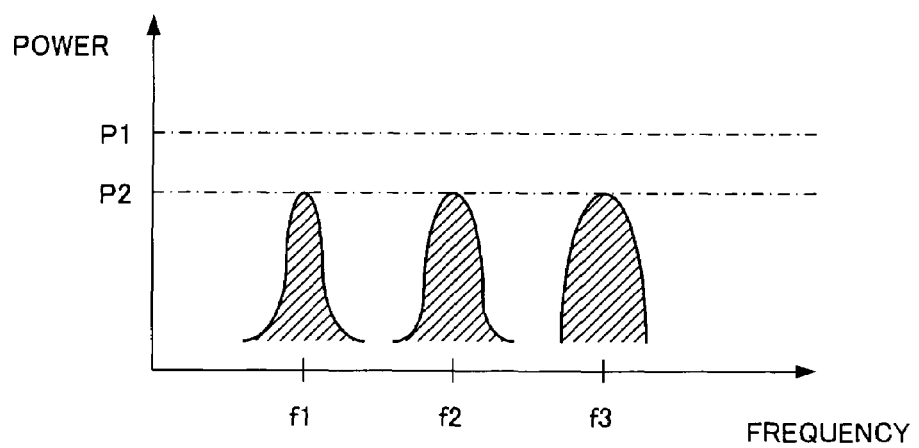
FIG. 3 illustrates a power-frequency relationship of a signal according to Embodiment 1 of the present invention.
Figure 4A:
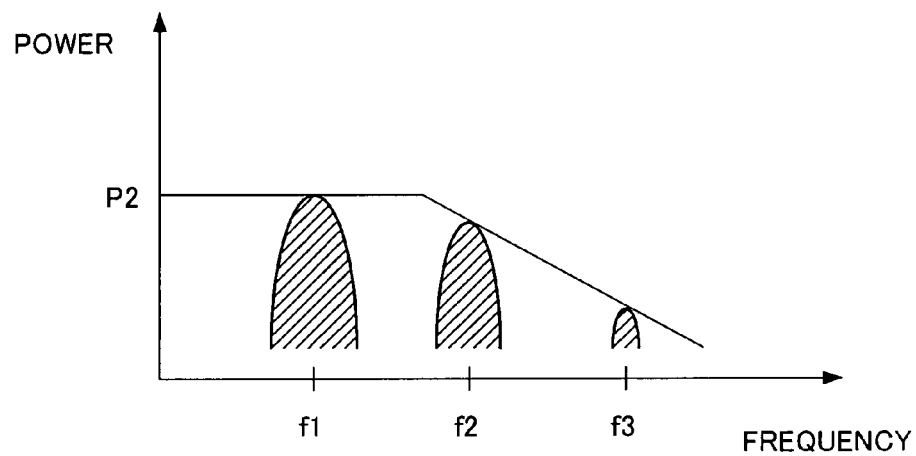
FIG. 4A illustrates a power-frequency relationship of a signal according to Embodiment 1 of the present invention.
Figure 4B:
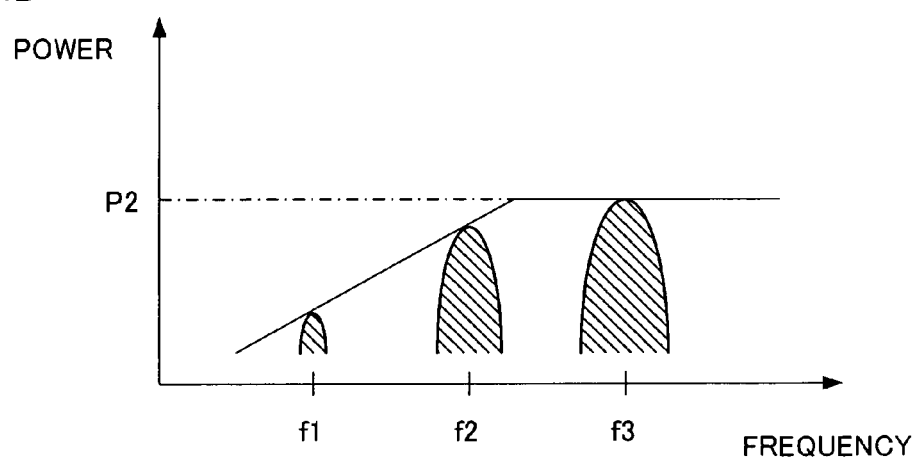
FIG. 4B illustrates a power-frequency relationship of a signal according to Embodiment 1 of the present invention.
Figure 4C:
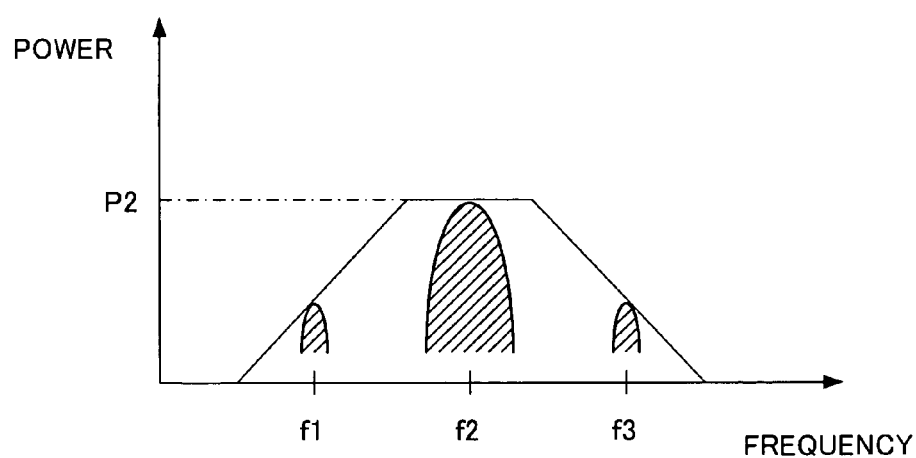
FIG. 4C illustrates a power-frequency relationship of a signal according to Embodiment 1 of the present invention.
Figure 5A:
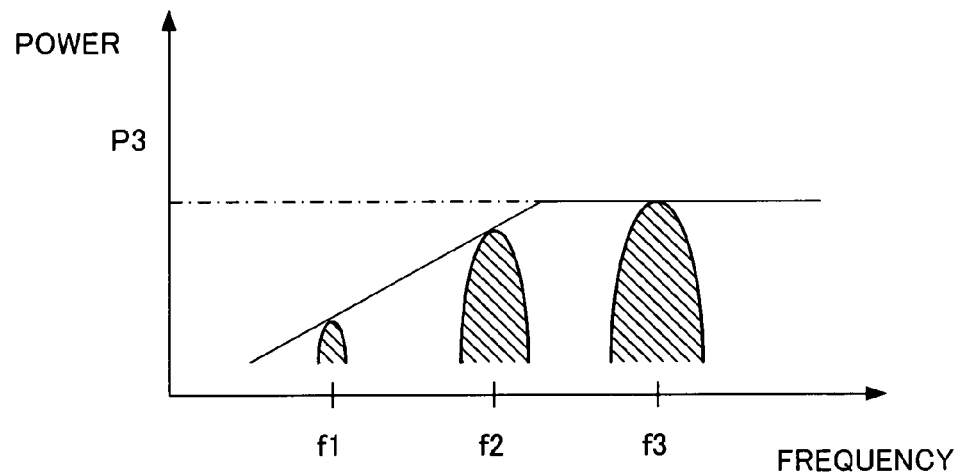
FIG. 5A illustrates a power-frequency relationship of a signal according to Embodiment 1 of the present invention.
Figure 5B:
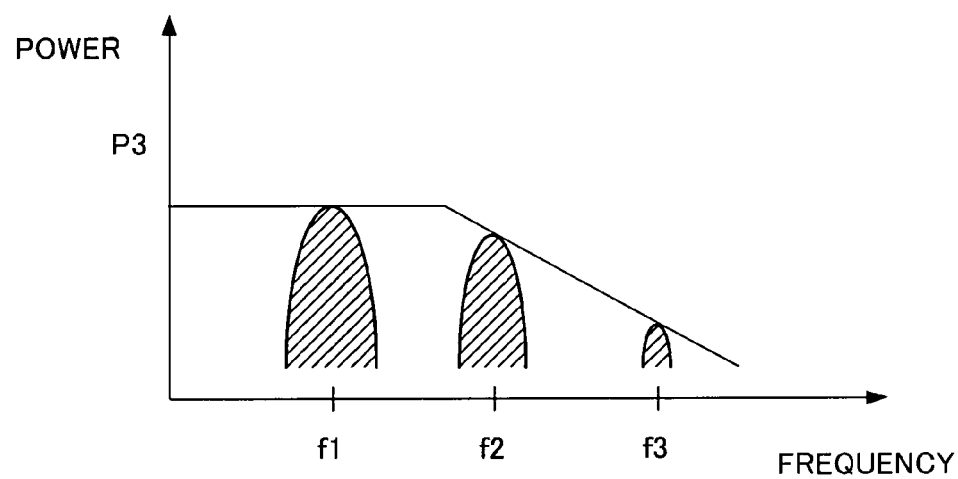
FIG. 5B illustrates a power-frequency relationship of a signal according to Embodiment 1 of the present invention.
Figure 5C:
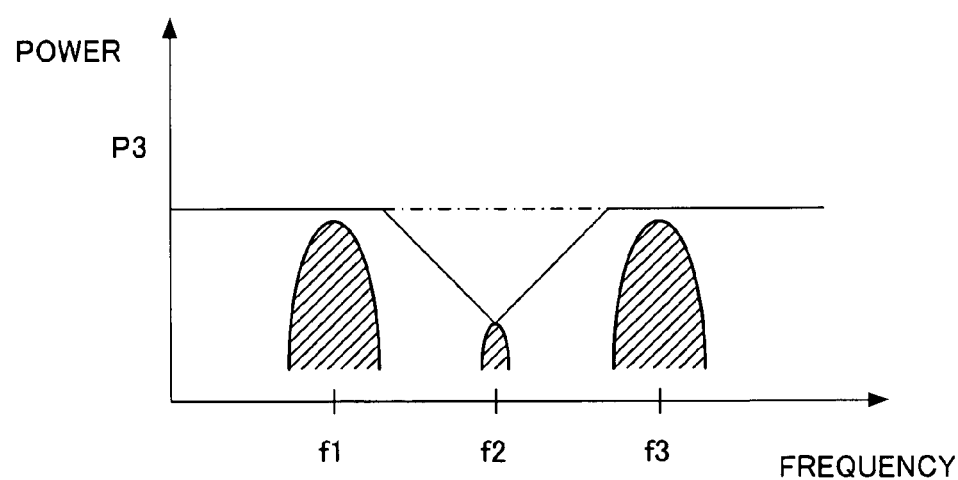
FIG. 5C illustrates a power-frequency relationship of a signal according to Embodiment 1 of the present invention.

First, a signal made up of frequency components f1, f2, f3 of power P1 is input from the signal input terminal 101 as shown in FIG. 2. Then, the signal is distributed by the distributor 103 into portions with the same amplitude, with power P2 (P1>P2) and amplitude reduced to half as shown in FIG. 3 and one of those signal outputs is subjected to a frequency selection at the filter 106. As a result, when the filter 106 is of a low pass type, an output signal with power descending in order of f1, f2, f3 as shown in FIG. 4A is obtained. On the other hand, when the filter 106 is of a high pass type, an output signal with power descending in order of f3, f2, f1 as shown in FIG. 4B is obtained. Furthermore, when the filter 106 is of a band pass type, an output signal with f2 having the highest power and the power of f1, f3 smaller than the power of f2 is obtained as shown in FIG. 4C. On the other hand, the other of the signal outputs of the distributor 103 is not subjected to any frequency selection, and therefore the signal in FIG. 3 is input to the non-inverted input terminal of the differential amplifier 107 and the signal in FIG. 4 is input to the inverted input terminal with the same phase. Because of an in-phase signal elimination action of the differential amplifier 107, an output signal representing a difference in amplitude components between the distributed signals distributed by the distributor 103 and input to the differential amplifier 107 as shown in FIG. 5 appears at the signal output terminals 102. That is, when a low pass type filter is used for the filter 106, an output signal with a low band amplitude component eliminated and having power descending in order of f3, f2, f1 is obtained as shown in FIG. 5A. On the other hand, when a high pass type filter is used for the filter 106, an output signal with the high band amplitude component eliminated and amplitude components having power descending in order of f1, f2, f3 is obtained as shown in FIG. 5B. Furthermore, when a band pass type filter is used for the filter 106, an output signal with f2 having the smallest power and the power of f1, f3 being greater than the power of f2 is obtained as shown in FIG. 5C. The largest output signal of each frequency of the differential amplifier 107 shown in FIG. 5 becomes P3 (P2>P3 if the gain is less than 0 [dB] and P2≦P3 if the gain is equal to or greater than 0 [dB]).

Then, the case where the attenuation characteristic of the filter 106 is of a band-reject type will be explained.

Figure 6:
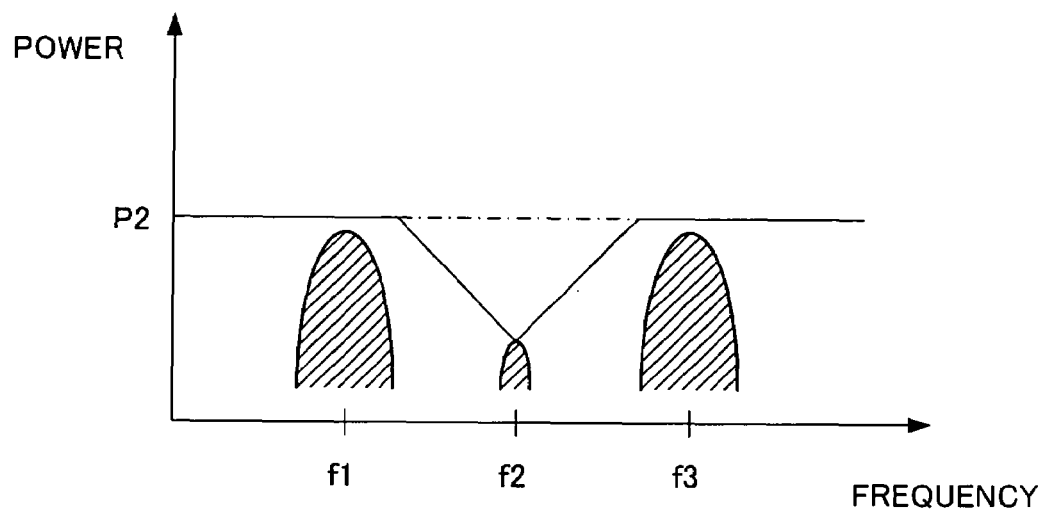
FIG. 6 illustrates a power-frequency relationship of a signal according to Embodiment 1 of the present invention.
Figure 7:
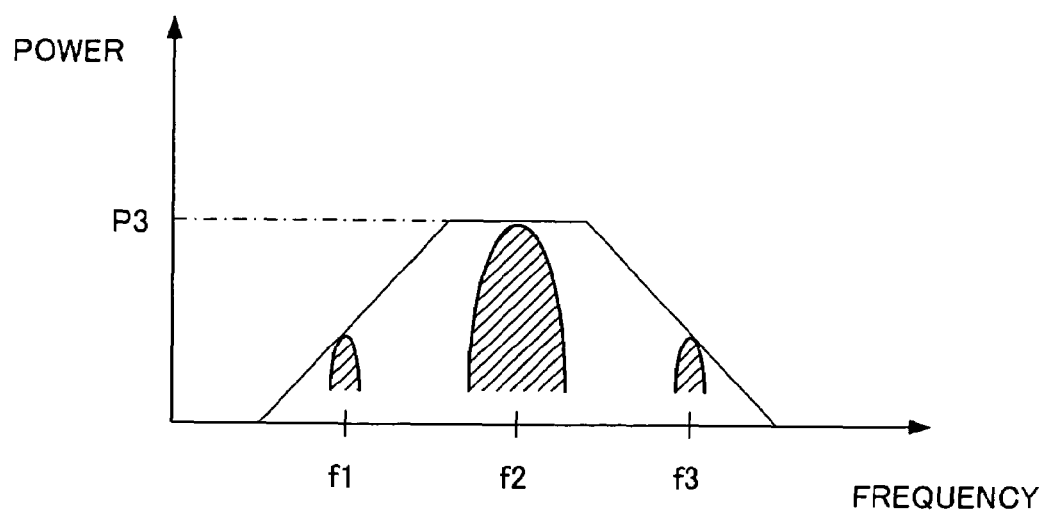
FIG. 7 illustrates a power-frequency relationship of a signal according to Embodiment 1 of the present invention.

As shown in FIG. 2, a signal made up of frequency components f1, f2, f3 of power P1 is input from the signal input terminal 101. Then, the signal is distributed by the distributor 103 into portions with the same amplitude, with power P2 (P1>P2) and amplitude reduced to half as shown in FIG. 3 and one of these signal outputs is subjected to a frequency selection at the filter 106. As a result, an output signal with f2 having the lowest power and the power of f1, f3 being greater than the power of f2 as shown in FIG. 6 is obtained. On the other hand, the other of the signal outputs of the distributor 103 is not subjected to any frequency selection, and therefore the signal in FIG. 3 is input to the non-inverted input terminal of the differential amplifier 107 and the signal in FIG. 6 is input to the inverted input terminal with the same phase. Because of an in-phase signal elimination action of the differential amplifier 107, an output signal representing the difference in amplitude components between the distributed signals distributed by the distributor 103 and input to the differential amplifier 107 as shown in FIG. 7 appears at the signal output terminals 102. That is, an output signal with f2 having the largest power and the power of f1, f3 being smaller than the power of f2 as shown in FIG. 7 is obtained. Here, the largest output signal of the differential amplifier 107 shown in FIG. 7 becomes P3 (P2>P3 if the gain is less than 0 [dB] and P2≦P3 if the gain is equal to or greater than 0 [dB]).

Therefore, when the rejection band of the filter 106 is set to a desired frequency band and the filter circuit 108 is applied to the reception section, the pass band of the filter 106 is set to a disturbing wave frequency band and when the filter circuit 108 is applied to a transmission section and local oscillation section, the pass band of the filter 106 is set to an unnecessary frequency component band, and it is thereby possible to extract only a desired frequency component.

The output signal from the signal output terminals 102 exists in the rejection band of the filter 106 and even if some loss is produced when the received signal of the rejection band is rejected, this loss has a minor influence on the received signal in the pass band.

Thus, according to this Embodiment 1, an input signal is distributed into two types, a difference in amplitude components between one distributed signal which is frequency-selected by a filter and the other distributed signal which is not frequency-selected is output from the differential amplifier, and it is therefore possible to maintain the attenuation characteristic or passage characteristic in a high frequency band. Furthermore, according to this Embodiment 1, when a band-reject type filter, which rejects a predetermined band, is used for the filter 106, it is possible to realize integration of a band pass type configuration having a steep attenuation characteristic in a high frequency band. Furthermore, this Embodiment 1 provides the buffers 104, 105 between the two output terminals of the distributor 103 and the following circuit and suppresses interference between two output signals from the distributor 103, and can thereby improve the stability of the attenuation characteristic.

According to Embodiment 1, a distributed signal which has not passed through the filter is input to the inverted input terminal of the differential amplifier 107 and a distributed signal which has passed through the filter is input to the non-inverted input terminal, but the present invention is not limited to this and can also be adapted so that the polarities of the input terminals of the differential amplifier 107 are inverted and the distributed signal which has not passed through the filter is input to the non-inverted input terminal and the distributed signal which has passed through the filter is input to the inverted input terminal.

EMBODIMENT 2

Figure 8:
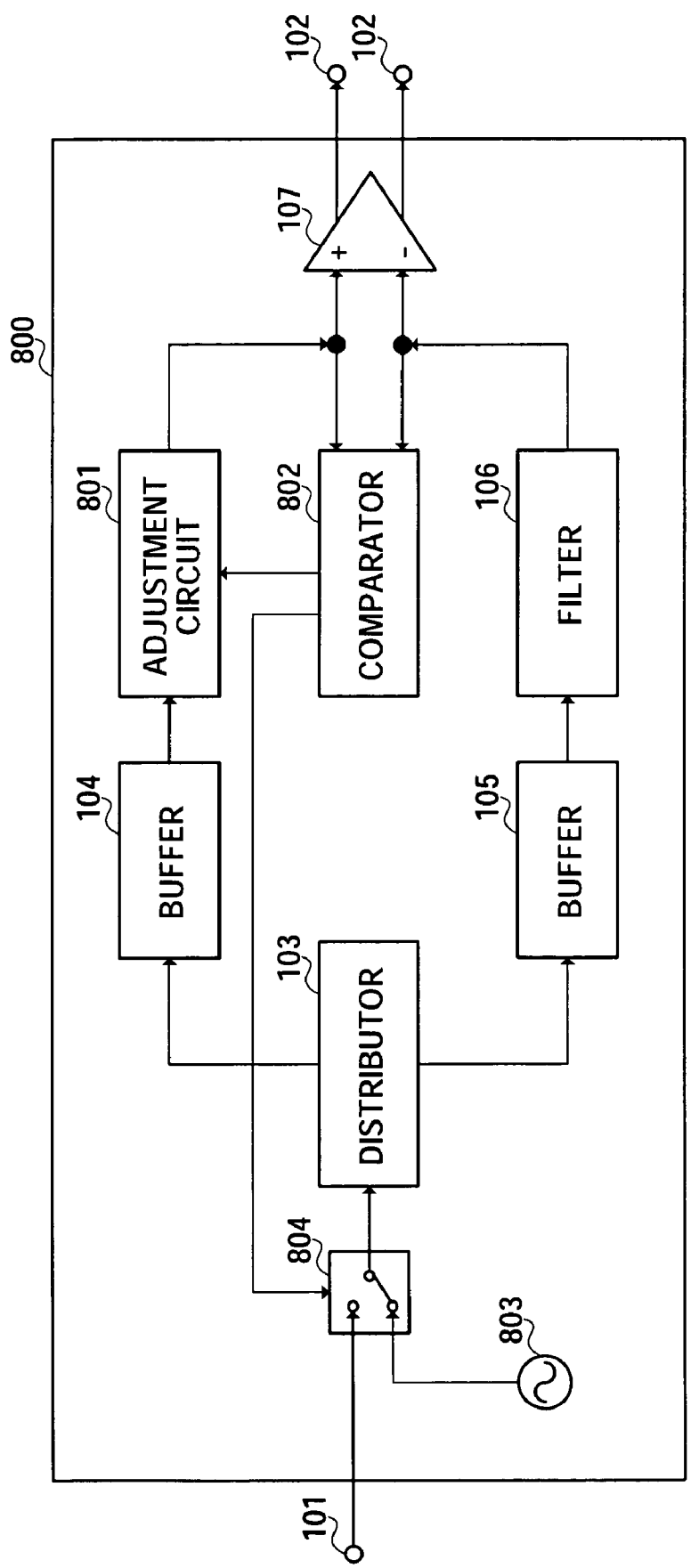
FIG. 8 is a block diagram showing a configuration of a filter circuit according to Embodiment 2 of the present invention.

FIG. 8 is a block diagram showing a configuration of a filter circuit 800 according to Embodiment 2 of the present invention.

The filter circuit 800 in this Embodiment 2 corresponds to the filter circuit 108 in Embodiment 1 shown in FIG. 1 with an adjustment circuit 801, a comparator 802, a reference signal source 803 and a switch 804 shown in FIG. 8 added.

In FIG. 8, the same components as those in FIG. 1 are assigned the same reference numerals and explanations thereof will be omitted.

In FIG. 8, when the adjustment circuit 801 operates as a calibration circuit, it gives a distributed signal input from the buffer 104 a phase rotation or amplitude attenuation equivalent to an amount of phase rotation or amount of amplitude attenuation which the filter 106 gives to a signal in the pass band and outputs the resultant signal to the comparator 802 and differential amplifier 107. Furthermore, when the adjustment circuit 801 does not operate as a calibration circuit, it gives a predetermined amount of phase rotation to the distributed signal input from the buffer 104, and can thereby make the band of the output signal output from the differential amplifier 107 variable. That is, the adjustment circuit 801 sets the amount of phase rotation to be given to the distributed signal input from the buffer 104 to a predetermined value, and can thereby make the band of the output signal output from the differential amplifier 107 variable.

When the adjustment circuit 801 operates as the calibration circuit, the comparator 802 detects a phase difference or amplitude difference between in-phase input signals to the differential amplifier 107 at the time of calibration, outputs a first control signal for indicating an amount of calibration of the adjustment circuit 801 to the adjustment circuit 801 and thereby adjusts the amount of calibration of the adjustment circuit 801 and stores calibration data after the calibration is completed. On the other hand, when the adjustment circuit 801 does not operate as the calibration circuit, the comparator 802 detects a phase difference between in-phase input signals to the differential amplifier 107 at the time of adjustment of the amount of phase rotation and outputs a first control signal for setting an amount of phase rotation so that the band of the output signal output from the differential amplifier 107 becomes a predetermined band to the adjustment circuit 801, and thereby adjusts the amount of phase rotation set by the adjustment circuit 801 and stores the amount of phase rotation set after the adjustment of the amount of phase rotation is completed.

More specifically, in both cases where the adjustment circuit 801 operates as the calibration circuit and where the adjustment circuit 801 does not operate as the calibration circuit, the comparator 802 compares the voltage (first voltage) at the midpoint (connection midpoint) of the transmission path connecting the adjustment circuit 801 and the non-inverted input terminal of the differential amplifier 107 with the voltage (second voltage) at the midpoint (connection midpoint) of the transmission path connecting the filter 106 and the inverted input terminal of the differential amplifier 107 and adjusts the amount of calibration or the amount of phase rotation of the adjustment circuit 801 so that the voltage difference falls below a predetermined value. Furthermore, the comparator 802 controls switching of the switch 804 in both cases where the adjustment circuit 801 operates as the calibration circuit and where the adjustment circuit 801 does not operate as the calibration circuit. When the frequency of the input signal to the distributor 103 is high and exceeds an allowable comparison operation range of the comparator 802, a frequency division circuit is provided inside the comparator 802 to reduce the comparison frequency.

Here, the "time of calibration" means an adjustment stage for setting a phase rotation or amplitude attenuation equivalent to the amount of phase rotation or amount of amplitude attenuation that the filter 106 gives to a signal in the pass band, the "time of completion of calibration" means a stage at which the setting of the phase rotation or amplitude attenuation is completed, the "time of adjustment of the amount of phase rotation" means an adjustment stage for setting the amount of phase rotation so as to obtain an output signal of a desired band from the differential amplifier 107 and the "time at which adjustment of the amount of phase rotation is completed" means a stage at which the setting of the amount of phase rotation is completed. When the adjustment circuit 801 operates as the calibration circuit, at the time of calibration, the comparator 802 repeatedly detects the phase difference or amplitude difference every time a distributed signal is input from the adjustment circuit 801 and filter 106 and adjusts the amount of calibration so that the detected phase difference or amplitude difference is reduced to a predetermined value.

On the other hand, when the adjustment circuit 801 does not operate as the calibration circuit, at the time of adjustment of the amount of phase rotation, the comparator 802 repeatedly detects the phase difference every time a distributed signal is input from the adjustment circuit 801 and filter 106 and adjusts the amount of phase rotation until the phase difference becomes a predetermined value so that an output signal in a predetermined band is obtained. At the time of calibration of the adjustment circuit 801 and at the time of adjustment of the amount of phase rotation, the reference signal source 803 sweeps the frequency at a certain output level and outputs the frequency to the distributor 103. Based on the control by the comparator 802, the switch 804 short-circuits between the signal input terminal 101 and distributor 103 when the calibration is completed and when the adjustment of the amount of phase rotation is completed and short-circuits between the reference signal source 803 and distributor 103 at the time of calibration and at the time of adjustment of the amount of phase rotation.

Note that the amplitude component output from the differential amplifier 107 is discarded at the time of calibration and at the time of adjustment of the amount of phase rotation and the comparator 802 is placed in a nonoperating state and no signal is input to the comparator when the calibration is completed and when the adjustment of the amount of phase rotation is completed.

Based on the considerations in the process led to the present invention, when the phase error or amplitude error of an in-phase input signal to the two input terminals of the differential amplifier 107 is equal to or higher than a predetermined value, the in-phase signal elimination effect is known to reduce and it can be said that it is important to reduce the phase error and amplitude error in realizing a steep attenuation characteristic of the filter circuit 800.

Thus, a method and procedure for calibrating the phase error and amplitude error at a high degree of accuracy will be explained.

In an ideal environment and when there is no variation in the components of the filter circuit 800, the adjustment circuit 801 is set so as to give the amount of phase rotation and amount of amplitude attenuation equivalent to those produced at the filter 106.

When the filter circuit 800 is made up of discrete components, the adjustment circuit 801 can be adjusted for every component which is applied to the filter 106, whereas when the components of the filter circuit 800 are formed on the same semiconductor substrate, individual adjustments cannot be made according to variations in the characteristics of the components, and therefore this Embodiment 2 initially changes the input path of the signal to the distributor 103 to the reference signal source 803 side using the switch 804 when power to the filter circuit 800 is turned on, monitors a phase error and amplitude error between two signals input to the differential amplifier 107 using the comparator 802 and controls the adjustment circuit 801 in such a way that the phase error and amplitude error converge within a predetermined error range. Note that when power is turned on from the next time onward, it is possible to use either a method of repeating a calibration operation again or a method of storing a first control signal output to the calibration circuit at the time of calibration at the comparator 802 and fixing the state of the adjustment circuit 801 and the adjustment circuit 801 is configured so as to be able to handle the above described two types of situations.

Then, in the case of an environment variation such as a temperature variation, the amount of phase rotation and the amount of amplitude attenuation produced at the filter 106 may be changed from the value when power is turned on, and therefore it is possible to improve the calibration accuracy by carrying out calibration similar to that when power is turned on at a timing at which the filter circuit 800 is set to a nonoperating state. The rest of the operation is the same as that in Embodiment 1, and therefore explanations thereof will be omitted. Moreover, the respective output signals are the same as those in FIG. 2 to FIG. 7, and therefore explanations thereof will be omitted.

Then, a case where the adjustment circuit 801 gives an amount of amplitude attenuation equivalent to that in the pass band of the filter 106 and adjusts the amount of phase rotation will be explained.

When the amount of phase rotation given by the adjustment circuit 801 is equivalent to that in the pass band of the filter 106, the frequency characteristics of the filter 106 and filter circuit 800 are inverted as already explained. Furthermore, the cutoff frequencies (3 dB attenuation point) of the filter 106 and the filter circuit 800 are the same.

When the amount of phase rotation given by the adjustment circuit 801 is different from that with the same frequency in the pass band of the filter 106, the in-phase elimination effect of the differential amplifier 107 cannot be obtained and even the area within the pass band of the filter 106 is no longer the rejection band of the filter circuit 800. Therefore, the cutoff frequency of the filter circuit 800 can be made variable.

In addition to the effects of aforementioned Embodiment 1, this Embodiment 2 suppresses the phase error or amplitude error of an in-phase input signal to the two input terminals of the differential amplifier 107 to a value less than a predetermined value using the reference signal source 803 for calibration, adjustment circuit 801 and comparator 802, and can thereby realize an extremely steep attenuation characteristic. Furthermore, this Embodiment 2 short-circuits between the reference signal source and the distributor at the time of calibration by the adjustment circuit 801 and sweeps the output frequency of the reference signal source, and can thereby realize calibration at a higher degree of accuracy.

When the adjustment circuit 801 does not operate as the calibration circuit, this Embodiment 2 only adjusts the amount of phase rotation, but the present invention is not limited to this and can also be adapted so that the adjustment circuit 801 adjusts both the amount of amplitude attenuation and amount of phase rotation, gives the phase rotation and amplitude attenuation equivalent to the amount of phase rotation and amount of amplitude attenuation given by the filter 106 to the signal in the pass band to the distributed signal input from the buffer 104 and adjusts the band of the output signal output from the differential amplifier 107 simultaneously. In this case, the adjustment circuit for adjusting the band of the output signal may be different from the calibration circuit for giving the amount of phase rotation and amount of amplitude attenuation or one circuit may be shared in place of the two circuits.

EMBODIMENT 3

Figure 9:
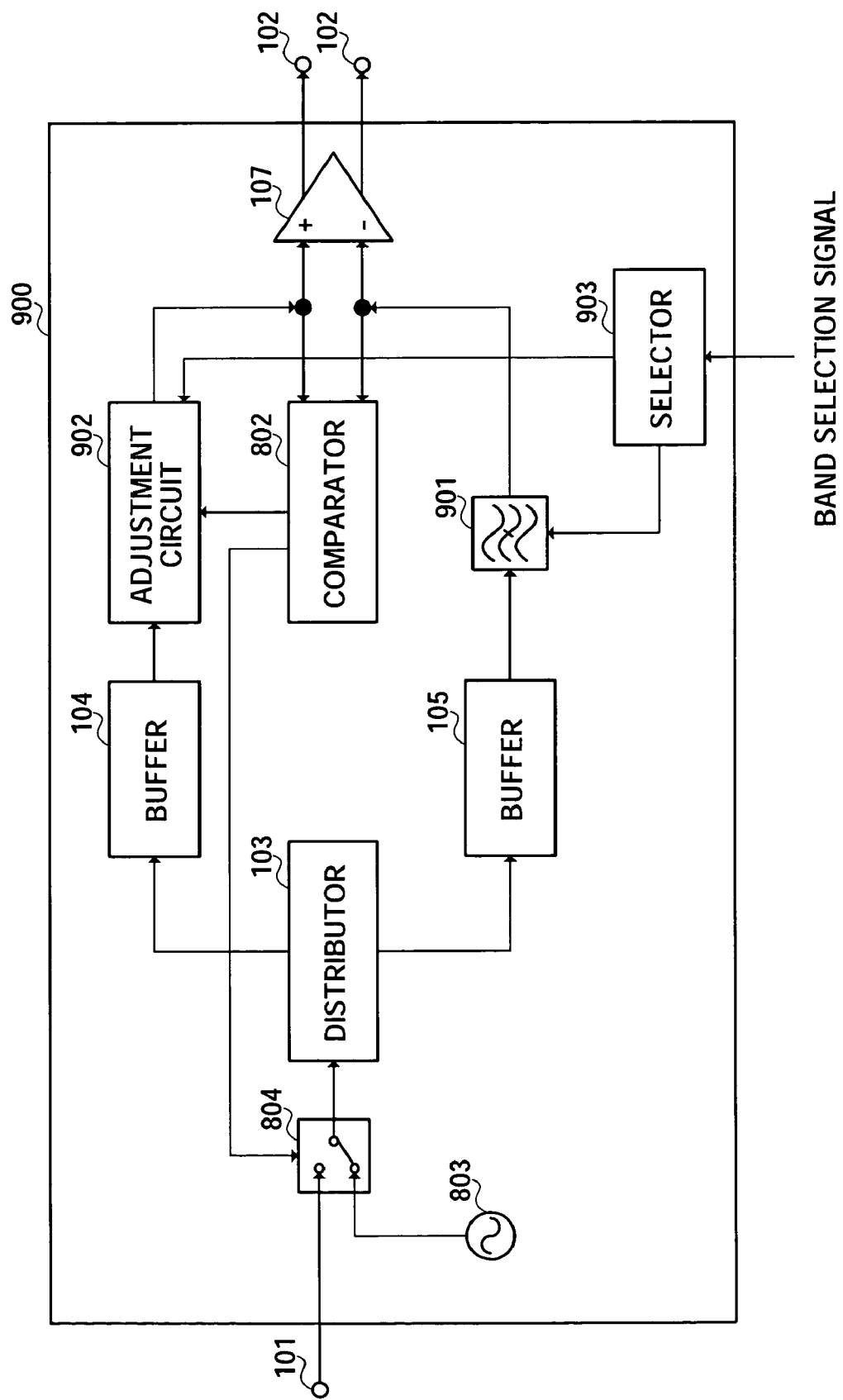
FIG. 9 is a block diagram showing a configuration of a filter circuit according to Embodiment 3 of the present invention.

FIG. 9 is a block diagram showing a configuration of a filter circuit 900 according to Embodiment 3 of the present invention.

The filter circuit 900 according to this Embodiment 3 corresponds to the filter circuit 800 according to Embodiment 2 shown in FIG. 8 with a selector 903 added, the filter 106 replaced by a filter 901 and the adjustment circuit 801 replaced by an adjustment circuit 902 as shown in FIG. 9. In FIG. 9, the same components as those in FIG. 1 and FIG. 8 are assigned the same reference numerals and explanations thereof will be omitted.

In FIG. 9, the filter 901 has a band-reject type configuration made up of an inductor and a capacitance and makes the rejection band variable by making the inductor value or capacitance value variable. That is, the filter 901 rejects passage of some frequency components in a predetermined communication band and allows only predetermined frequency components to pass. Then, the filter 901 outputs the frequency components in the pass band other than the rejection band within the pass band of the distributed signal input from the buffer 105 to the differential amplifier 107. When the adjustment circuit 902 operates as the calibration circuit, the adjustment circuit 902 gives a phase rotation, amplitude attenuation equivalent to the amount of phase rotation, amount of amplitude attenuation given by the filter 901 to a signal in the pass band to the output signal from the buffer 104 and outputs the output signal to the differential amplifier 107 and comparator 802. On the other hand, when the adjustment circuit 902 does not operate as the calibration circuit, the adjustment circuit 902 gives a predetermined amount of phase rotation to the distributed signal input from the buffer 104, and can thereby make the band of the output signal output from the differential amplifier 107 variable. That is, the adjustment circuit 902 sets the amount of phase rotation to be given to the distributed signal input from the buffer 104 to a predetermined amount of phase rotation, and can thereby make the band of the output signal output from the differential amplifier 107 variable as in the case of making the band of the distributed signal passing through the filter 106 variable. The selector 903 outputs to the adjustment circuit 902 a second control signal for controlling the rejection band of the filter 901 based on a band selection signal for selecting the band of the filter 901 input from a detection circuit (not shown) and at the same time controlling the amount of phase rotation and amount of amplitude attenuation of the adjustment circuit 902 according to a variation in the amount of phase rotation and amount of amplitude attenuation caused by the change of the rejection band of the filter 901. Note that the amplitude component output from the differential amplifier 107 is discarded at the time of calibration and the comparator 802 is set to a nonoperating state and no signal is input to the comparator 802 when the calibration is completed.

The operation of the filter circuit 900 configured as described above will be explained below.

Through the user's manual selection of a radio set to which the filter circuit 900 is applied or automatic selection based on the reception field intensity detected by the radio set and base station control channel information, a band selection signal is input to the selector 903. A band variable signal is output from the selector 903 which received the band selection signal to the filter 901 and the rejection band of the filter 901 is fixed.

When a band selection signal, which selects a band different from the previous band, is received, the amount of phase rotation and amount of amplitude attenuation in the pass band are also changed at the filter 901 caused by the change of the rejection band. When the adjustment circuit 902 gives a fixed amount of phase rotation and amount of amplitude attenuation to the input signal, the filter circuit 900 cannot maintain the attenuation characteristic, and therefore the adjustment circuit 902 stores input signal calibration data corresponding to the amount of phase rotation and amount of amplitude attenuation in the pass band of the filter 901 which vary according to the band variable signal or provides an individual circuit corresponding to each amount of phase rotation and amount of amplitude attenuation, and the selector 903 changes the state of the adjustment circuit 902 according to the second control signal according to the band variable signal. After the above described change is completed, the phase error or amplitude error of the in-phase input signal to the two input terminals of the differential amplifier 107 is suppressed to less than a predetermined value through the same process as that in Embodiment 2. Furthermore, when the adjustment circuit 902 does not operate as the calibration circuit, the adjustment circuit 902 gives a predetermined amount of phase rotation to the distributed signal input from the buffer 104, and can thereby change the band of the output signal output from the differential amplifier 107 in the same way that the filter 901 changes the rejection band. The rest of the operation is the same as that in Embodiment 1 and Embodiment 2 and therefore explanations thereof will be omitted. Furthermore, the respective output signals are the same as those in FIG. 2, FIG. 3, FIG. 6 and FIG. 7 and therefore explanations thereof will be omitted.

As shown above, in addition to the effects of Embodiment 1 and Embodiment 2, this Embodiment 3 adopts a band-reject type configuration for the filter 901, and can thereby integrate the band pass type filter, which can make the pass band variable. Furthermore, this Embodiment 3 controls the rejection band of the filter 901 and at the same time controls the amount of phase rotation and amount of amplitude attenuation of the adjustment circuit 902 according to the rejection band of the filter 901, and can thereby flexibly handle changes in the desired band and realize a steeper attenuation characteristic. Furthermore, this Embodiment 3 can change the band of the output signal output from the differential amplifier 107 using both the filter 901 and adjustment circuit 902, and can thereby obtain the output signal in a desired band at a high speed.

According to this Embodiment 3, the band selection signal is input from the outside of the filter circuit 900, but the present invention is not limited to this and can also be adapted so that a function of generating a band selection signal is incorporated as the function of the filter circuit 900, a band selection signal generation section is provided and the band selection signal is input to the selector 903 from the band selection signal generation section inside the filter circuit 900.

EMBODIMENT 4

Figure 10:
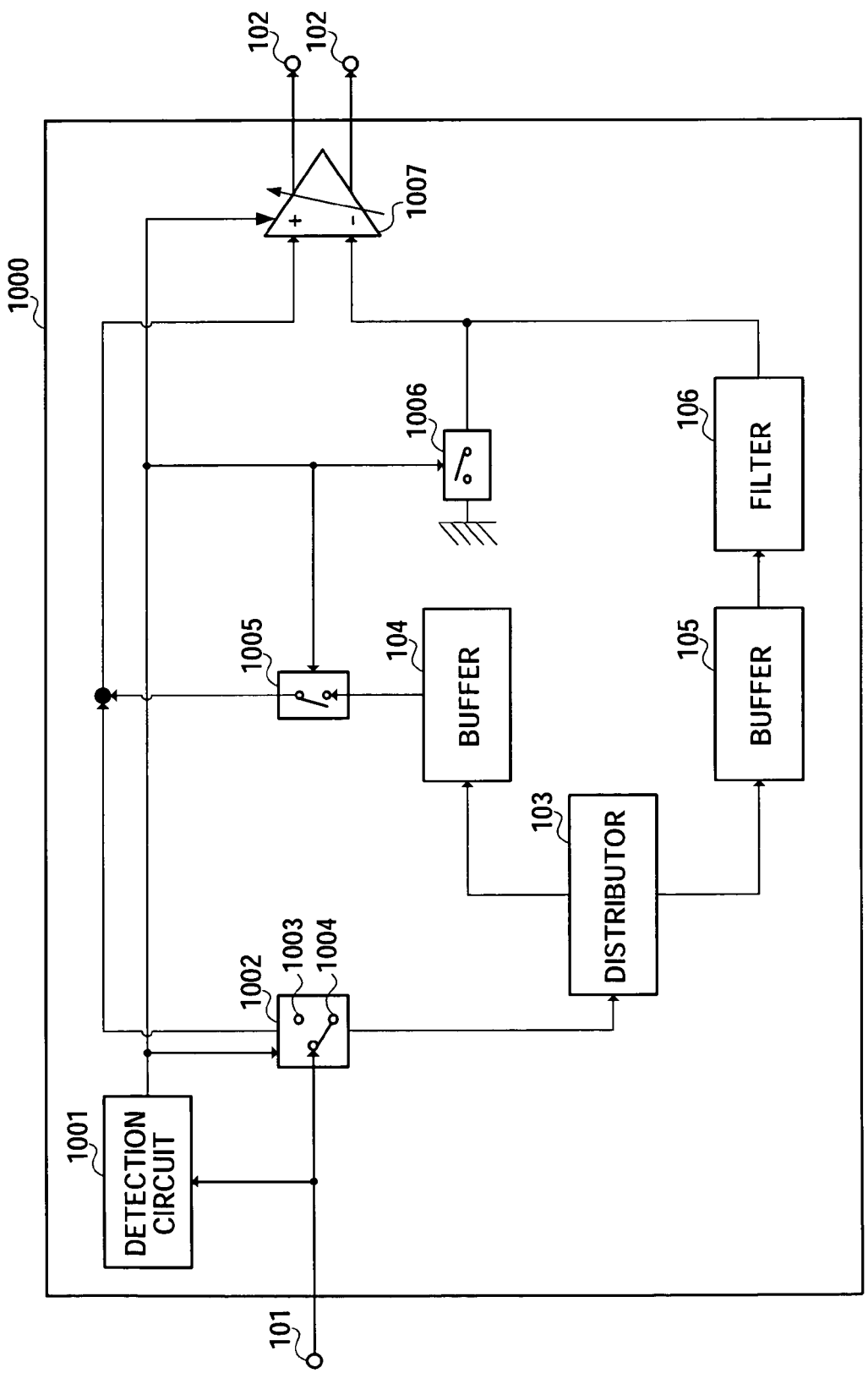
FIG. 10 is a block diagram showing a configuration of a filter circuit according to Embodiment 4 of the present invention.

FIG. 10 is a block diagram showing a configuration of a filter circuit according to Embodiment 4 of the present invention.

The filter circuit 1000 according to this Embodiment 4 corresponds to the filter circuit 108 according to Embodiment 1 shown in FIG. 1 with a detection circuit 1001, a switch 1002, a switch 1005 and a switch 1006 added as shown in FIG. 10 and the differential amplifier 107 replaced by a differential amplifier 1007. Note that in FIG. 10, the same components as those in FIG. 1 are assigned the same reference numerals and explanations thereof will be omitted.

In FIG. 10, the detection circuit 1001 detects disturbing waves or unnecessary frequency components other than a desired frequency band, and when any disturbing wave or unnecessary frequency component is detected, the detection circuit 1001 changes the switch 1002 so that the signal input terminal 101 and the distributor 103 are connected and when no disturbing wave or unnecessary frequency component is detected, the detection circuit 1001 changes the switch 1002 so that the signal input terminal 101 and the non-inverted input terminal of the differential amplifier 1007 are connected. The switch 1002 has a switch terminal 1003 and a switch terminal 1004, short-circuits between the signal input terminal 101 and the switch terminal 1003 or the switch terminal 1004 based on the detection result of the detection circuit 1001 and thereby changes the path when the signal input terminal 101 is connected to the non-inverted input terminal of the differential amplifier 1007 and when the signal input terminal 101 is connected to the distributor 103. The switch 1005 changes the path when the buffer 104 is connected to the non-inverted input terminal of the differential amplifier 1007 and when the buffer 104 is connected to no circuit based on the detection result of the detection circuit 1001. The switch 1006 changes the path when the inverted input terminal of the differential amplifier 1007 is grounded and when the inverted input terminal is connected to the filter 106 based on the detection result of the detection circuit 1001. The differential amplifier 1007 outputs a difference in amplitude components between the distributed signal input from the buffer 104 to the non-inverted input terminal and the distributed signal input from the filter 106 to the inverted input terminal or a difference in amplitude components between the input signal input from the signal input terminal 101 to the non-inverted input terminal and the grounded inverted input terminal to the signal output terminals 102. Furthermore, the differential amplifier 1007 changes the gain based on the detection result at the detection circuit 1001. That is, the differential amplifier 1007 gives the gain for complementing the attenuation in the input signal produced when the input signal is distributed by the distributor 103 to the input distributed signal.

The operation of the filter circuit configured as shown above will be explained below.

When the detection circuit 1001 detects no disturbing wave or unnecessary frequency component, the switch 1002 short-circuits between the switch terminal 1003 and the signal input terminal 101, the switch 1005 disconnects the input terminal from the output terminal and the switch 1006 short-circuits between the input terminal and the output terminal and grounds the inverted input terminal of the differential amplifier 1007 and at the same time sets the gain of the differential amplifier 1007 to G1[dB]. On the other hand, when the detection circuit 1001 detects a disturbing wave or unnecessary frequency component, the switch 1002 short-circuits between the switch terminal 1004 and the signal input terminal 101, the switch 1005 short-circuits between the input and output terminals, and the switch 1006 disconnects the input terminal from the output terminal and at the same time sets the gain of the differential amplifier 1007 to G2 (G2=G1+3)[dB] to complement the attenuation of the filter 106 to thereby suppress a level variation at the signal output terminal 102 at the time of switching of the circuit. The rest of the operation is the same as that in Embodiment 1 and explanations thereof will be omitted. Furthermore, the respective output signals are the same as those in FIG. 2 to FIG. 7 and therefore explanations thereof will be omitted.

Thus, in addition to the effects in Embodiment 1, in an environment in which no disturbing wave or unnecessary frequency component exists, this Embodiment 4 changes the switch 1002 so that the signal input terminal 101 is directly connected to the non-inverted input terminal of the differential amplifier 1007 to switch between the operation/non-operation of the function of the filter 106, preventing the received signal at a desired frequency from attenuating, and can thereby suppress the gain of the differential amplifier 1007 and reduce the current consumption. Furthermore, when the detection circuit 1001 detects a frequency component other than the desired frequency, this Embodiment 4 changes the setting of the differential amplifier 1007 to the gain for complementing the attenuation at the time of signal distribution, and can thereby keep the output level constant.

In this Embodiment 4, the distributed signal output from the buffer 104 is directly input to the non-inverted input terminal of the differential amplifier 1007, but the present invention is not limited to this, and as in the case of Embodiment 2, it is also possible to add a calibration circuit for suppressing a phase error or amplitude error of an in-phase input signal to the two input terminals of the differential amplifier 1007 to less than a predetermined value between the buffer 104 the non-inverted input terminal of the differential amplifier 1007 or adopt a band-reject type filter whose rejection band is variable for the filter 106 and at the same time add a calibration circuit for suppressing the phase error or amplitude error of the in-phase input signal to the two input terminals of the differential amplifier 1007 to less than a predetermined value or a selector for changing the band of the filter 106 in a variable manner. This allows a steeper attenuation characteristic to be realized for the filter circuit. Furthermore, in this Embodiment 4, the band of the distributed signal that passes through the filter 106 is fixed, but the present invention is not limited to this and can be adapted so that a band rejection type configuration is used for the filter 106 and a selector is provided as in the case of Embodiment 3 and the band for rejecting the passage of the filter 106 is made variable. Furthermore, when the detection circuit 1001 detects a disturbing wave or unnecessary frequency component, this Embodiment 4 increases the gain of the differential amplifier 1007 by 3 [dB], but the present invention is not limited to this and the gain can be set to an arbitrary value.

EMBODIMENT 5

Figure 11:
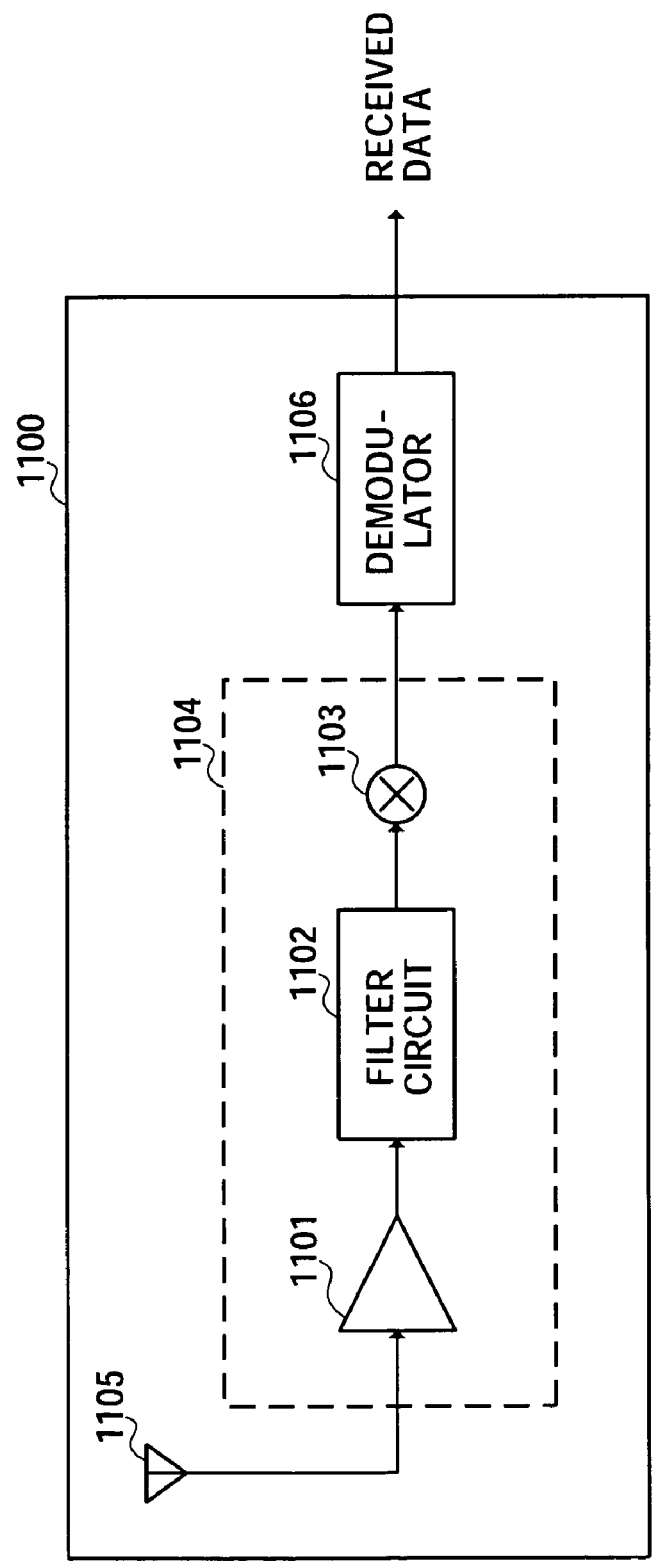
FIG. 11 is a block diagram showing a configuration of a radio apparatus according to Embodiment 5 of the present invention.

FIG. 11 is a block diagram showing a configuration of a radio apparatus 1100 according to Embodiment 5 of the present invention. A low-noise amplifier 1101, a filter circuit 1102 and a mixer 1103 constitute a high-frequency section 1104.

In FIG. 11, the low-noise amplifier 1101 amplifies a received signal received by the antenna 1105 and outputs the amplified signal to the filter circuit 1102. The filter circuit 1102 allows a desired frequency component of the received signal input from the low-noise amplifier 1101 to be passed and output to the mixer 1103. Here, for the filter circuit 1102, any one of the filter circuit 108 in FIG. 1, filter circuit 800 in FIG. 8, filter circuit 900 in FIG. 9 and filter circuit 1000 in FIG. 10 can be applied as appropriate. The mixer 1103 converts the frequency of the received signal input from the filter circuit 1102 and outputs the received signal to the demodulator 1106. The demodulator 1106 demodulates the received signal input from the mixer 1103 and obtains reception data.

The operation of the radio apparatus 1100 configured as shown above will be explained below.

A disturbing wave or unnecessary frequency component other than a desired frequency band existing at the output of the low-noise amplifier 1101 is attenuated by the filter circuit 1102 to prevent saturation of the mixer 1103. The operation of the filter circuit 1102 is the same as that described in any one of Embodiment 1 to Embodiment 4 and explanations thereof will be omitted.

In addition to the effects of Embodiment 1 to Embodiment 4, this Embodiment 5 attenuates a disturbing wave or unnecessary frequency component other than a desired frequency band existing at the output of the low-noise amplifier 1101 using the filter circuit 1102 and prevents saturation of the mixer 1103, and can thereby suppress deterioration of the sensitivity of the demodulator 1106. Furthermore, by adopting the same configuration as that of any one of the filter circuits 108, 800, 900, 1000 for the filter circuit 1102, this Embodiment 5 facilitates the formation of the high-frequency section 1104 on the same semiconductor substrate because all these filter circuits have a high degree of integration and affinity, and can thereby realize miniaturization of the radio apparatus 1100 and reduce the number of parts.

In this Embodiment 5, the filter circuit 1102 is interposed between the low-noise amplifier 1101 and mixer 1103, but the present invention is not limited to this and can also be adapted so that the filter circuit 1102 is disposed at a position other than between the low-noise amplifier 1101 and mixer 1103 in the high-frequency section 1104 to enhance integration of the filter circuit in a high-frequency band and obtain a steep attenuation characteristic. Furthermore, in this Embodiment 5, the filter circuit 1102 is used at the high-frequency section 1104, but the present invention is not limited to this and the filter circuit 1102 can be used in a low frequency section, etc., other than the high-frequency section 1104.

EMBODIMENT 6

Figure 12:
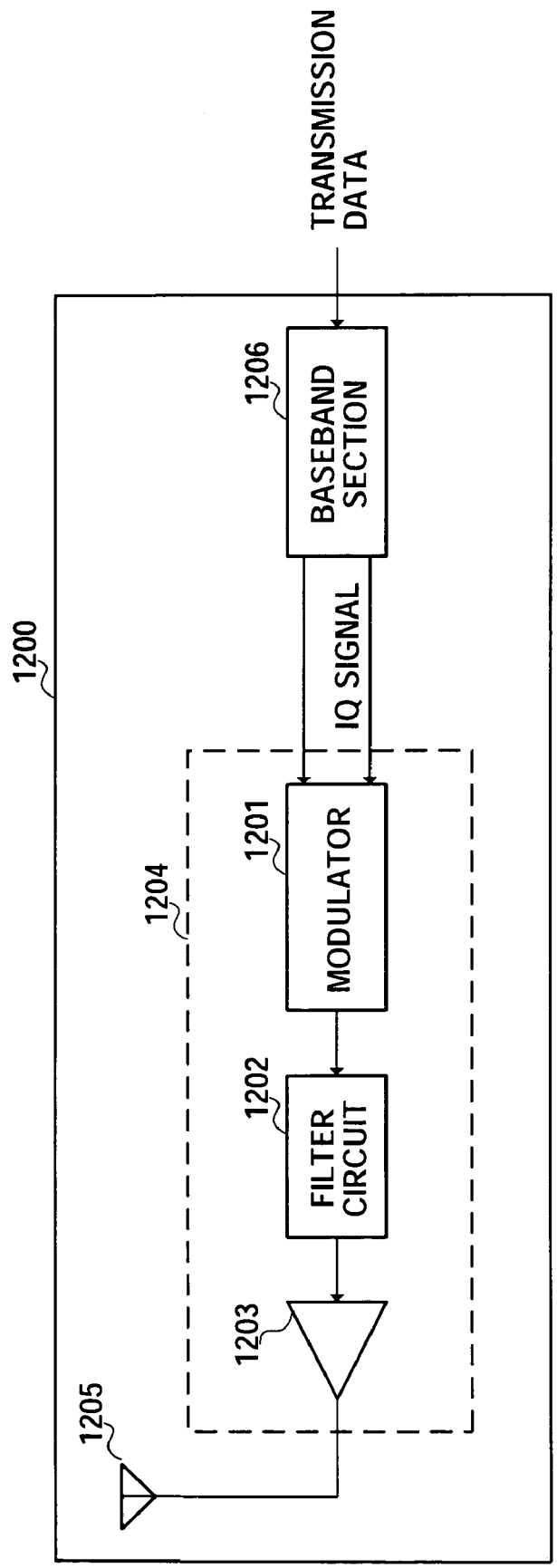
FIG. 12 is a block diagram showing a configuration of a radio apparatus according to Embodiment 6 of the present invention.

FIG. 12 is a block diagram showing a configuration of a radio apparatus 1200 according to Embodiment 6 of the present invention. A modulator 1201, a filter circuit 1202 and a power amplifier 1203 constitute a high-frequency section 1204.

In FIG. 12, the modulator 1201 modulates a transmission signal input from the baseband section 1206 and outputs the modulated signal to the filter circuit 1202. The filter circuit 1202 allows a desired frequency component of the transmission signal input from the modulator 1201 to pass and outputs the frequency component to the power amplifier 1203. Here, any one of the filter circuit 108 in FIG. 1, the filter circuit 800 in FIG. 8, the filter circuit 900 in FIG. 9 and the filter circuit 1000 in FIG. 10 can be used for the filter circuit 1202 as appropriate. The power amplifier 1203 amplifies transmit power in the transmission signal input from the filter circuit 1202 and transmits the transmission signal from the antenna 1205. The baseband section 1206 processes transmission data into a baseband, generates a transmission signal and outputs the transmission signal generated to the modulator 1201.

The operation of the radio apparatus 1200 configured as shown above will be explained below.

The unnecessary frequency component other than a desired frequency band existing at the output of the modulator 1201 is attenuated at the filter circuit 1202. The operation of the filter circuit 1202 is the same as those of Embodiment 1 to Embodiment 4 and explanations thereof will be omitted.

In addition to the effects of Embodiment 1 to Embodiment 4, this Embodiment 6 attenuates the unnecessary frequency component other than a desired frequency band existing at the output of the modulator 1201 using the filter circuit 1202, and can thereby suppress unnecessary radiation from the antenna 1205. Furthermore, by adopting the same configuration as that of any one of the filter circuits 108, 800, 900, 1000 for the filter circuit 1202, this Embodiment 6 facilitates the formation of the high-frequency section 1204 on the same semiconductor substrate because all these filter circuits have a high degree of integration and affinity, and can thereby realize miniaturization of the radio apparatus 1200 and reduce the number of parts.

In this Embodiment 6, the filter circuit 1202 is interposed between the modulator 1201 and power amplifier 1203, but the present invention is not limited to this and can also be adapted so that the filter circuit 1202 is disposed at a position other than between the modulator 1201 and power amplifier 1203 in the high-frequency section 1204 to enhance integration of the filter circuit in a high-frequency band and obtain a steep attenuation characteristic. Furthermore, in this Embodiment 6, the filter circuit 1202 is used at the high-frequency section 1204, but the present invention is not limited to this and the filter circuit 1202 can also be used in a low frequency section other than the high-frequency section 1204.

EMBODIMENT 7

Figure 13:
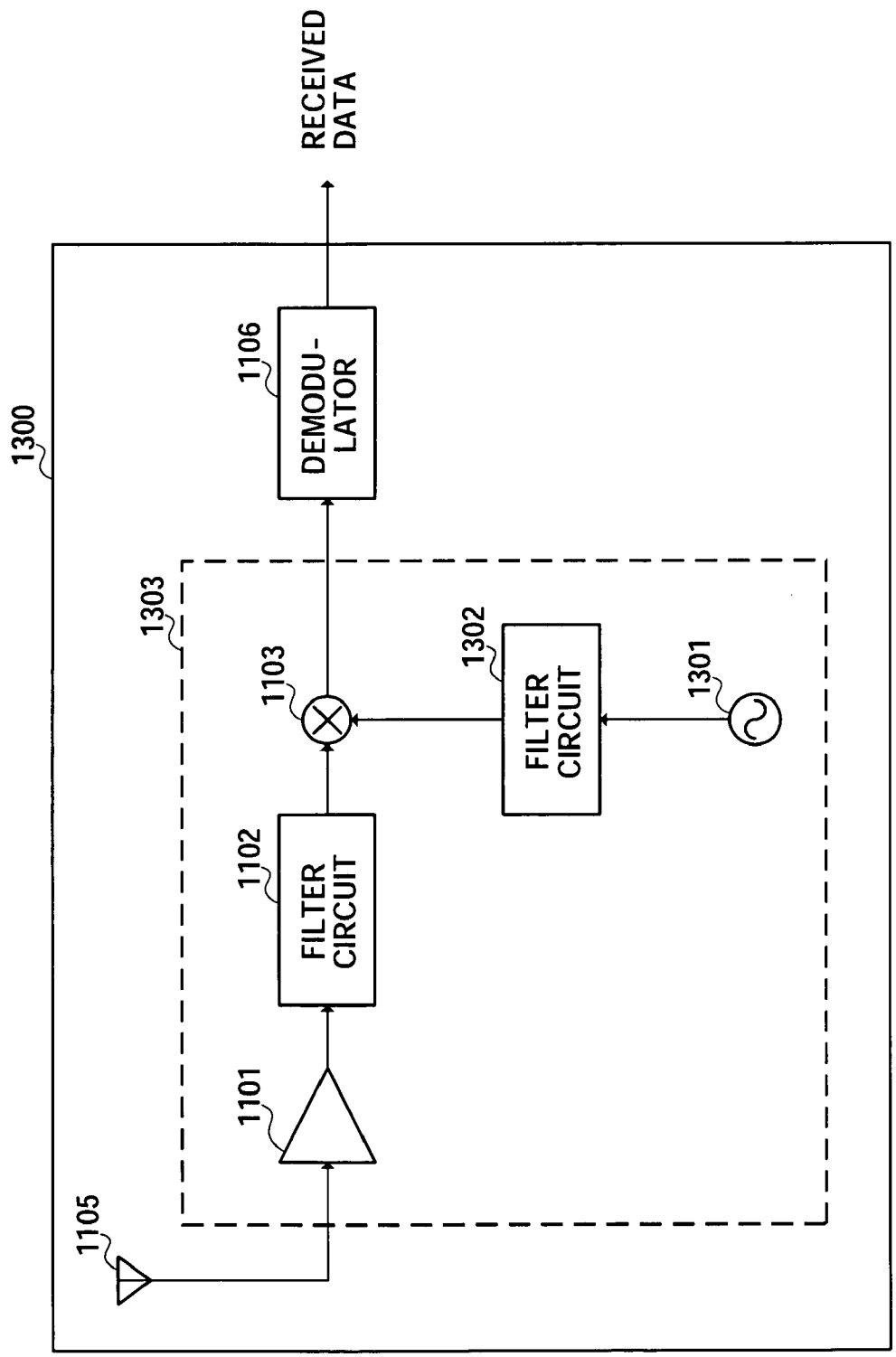
FIG. 13 is a block diagram showing a configuration of a radio apparatus according to Embodiment 7 of the present invention.

FIG. 13 is a block diagram showing a configuration of a radio apparatus 1300 according to Embodiment 7 of the present invention.

The radio apparatus 1300 according to this Embodiment 7 corresponds to the radio apparatus 1100 according to Embodiment 5 shown in FIG. 11 with a local oscillator 1301 and a filter circuit 1302 added as shown in FIG. 13. In FIG. 13, the same components as those in FIG. 11 are assigned the same reference numerals and explanations thereof will be omitted.

The low-noise amplifier 1101, filter circuit 1102, mixer 1103, local oscillator 1301 and filter circuit 1302 constitute a high-frequency section 1303.

In FIG. 13, the local oscillator 1301 generates a signal with a predetermined frequency for frequency conversion and outputs the signal to the filter circuit 1302. The filter circuit 1302 allows a desired frequency component of the signal for frequency conversion input from the local oscillator 1301 to pass and outputs the desired frequency component to the mixer 1103. Here, any one of the filter circuit 108 in FIG. 1, the filter circuit 800 in FIG. 8, the filter circuit 900 in FIG. 9 and the filter circuit 1000 in FIG. 10 can be used for the filter circuit 1302 as appropriate.

In the radio apparatus 1300 configured as shown above, the unnecessary frequency component other than a desired frequency band existing at the output of the local oscillator 1301 is attenuated at the filter circuit 1302.

Thus, in addition to the effects of Embodiment 1 to Embodiment 4, this Embodiment 7 attenuates the unnecessary frequency component other than the desired frequency components existing at the output of the local oscillator 1301 using the filter circuit 1302, and can thereby suppress mutual modulation distortion produced at the mixer 1103 and suppress deterioration of the sensitivity of the demodulator 1106. Furthermore, by adopting the same configuration as that of any one of the filter circuits 108, 800, 900, 1000 for the filter circuit 1302, this Embodiment 7 facilitates the formation of the high-frequency section 1303 on the same semiconductor substrate because all these filter circuits have a high degree of integration and affinity, and can thereby realize miniaturization of the radio apparatus 1300 and reduce the number of parts.

In this Embodiment 7, the filter circuit 1102 is interposed between the low-noise amplifier 1101 and mixer 1103 in the high frequency section 1303 and the filter circuit 1302 is interposed between the local oscillator 1301 and mixer 1103 in the high frequency section 1303, but the present invention is not limited to this and can also be adapted so that the filter circuit 1102 is disposed at a position other than between the low-noise amplifier 1101 and mixer 1103 in the high frequency section 1303 or the filter circuit 1302 is disposed at a position other than between the local oscillator 1301 and mixer 1103 in the high-frequency section 1303 to enhance integration of the filter circuit in a high-frequency band and obtain a steep attenuation characteristic. Furthermore, in this Embodiment 7, the filter circuits 1102, 1302 are used at the high-frequency section 1303, but the present invention is not limited to this and the filter circuits 1102, 1302 can also be used in a low frequency section other than the high-frequency section 1303.

EMBODIMENT 8

Figure 14:
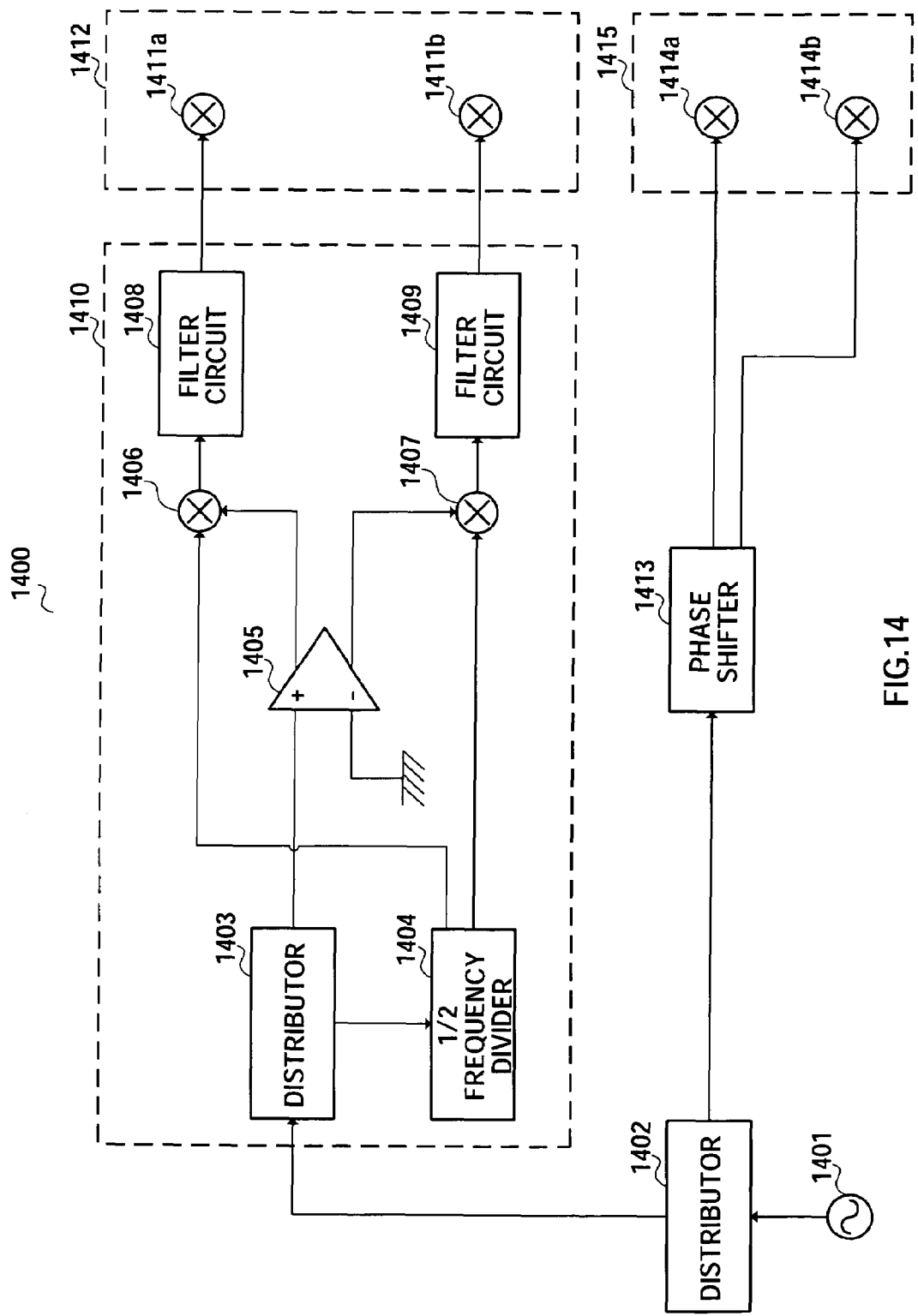
FIG. 14 is a block diagram showing a configuration of a radio apparatus according to Embodiment 8 of the present invention.

FIG. 14 is a block diagram showing a configuration of a radio apparatus 1400 according to Embodiment 8 of the present invention. A distributor 1403, a ½ frequency divider 1404, a differential amplifier 1405, an even harmonics mixer 1406, an even harmonics mixer 1407, a filter circuit 1408 and a filter circuit 1409 constitute a frequency conversion circuit 1410. Furthermore, orthogonal demodulators 1411a, 1411b constitute a receiver 1412. Furthermore, orthogonal demodulators 1414a, 1414b constitute a receiver 1415. Here, the receiver 1412 is a direct conversion receiver using a radio frequency of 2.5×f0 and the receiver 1415 is a direct conversion receiver using a radio frequency of f0.

In FIG. 14, the local oscillator 1401 generates a frequency of f0 and outputs it to the distributor 1402. The distributor 1402 distributes the signal with the frequency f0 input from the local oscillator 1401 and outputs the distributed signals to the distributor 1403 and phase shifter 1413. The distributor 1403 distributes the signal input from the distributor 1402 and outputs the distributed signal to the ½ frequency divider 1404 and the non-inverted input terminal of the differential amplifier 1405. The ½ frequency divider 1404 divides the frequency of the signal input from the distributor 1403 to ½ and outputs it to the even harmonics mixer 1406 and even harmonics mixer 1407. The inverted input terminal of the differential amplifier 1405 is grounded and the differential amplifier 1405 outputs the distributed signal input from the distributor 1403 to the even harmonics mixers 1406, 1407. The even harmonics mixer 1406 mixes a frequency (2×f0) doubling the output frequency of the differential amplifier 1405 and the output frequency (0.5×f0) of the ½ frequency divider 1404 and outputs the mixed frequency to the filter circuit 1408. The even harmonics mixer 1407 mixes a frequency (2×f0) doubling the output frequency of the differential amplifier 1405 and the output frequency (0.5×f0) of the ½ frequency divider 1404 and outputs the mixed frequency to the filter circuit 1409. The filter circuit 1408 allows a desired frequency component of the signal input from the even harmonics mixer 1406 to pass and outputs the desired frequency component to the orthogonal demodulator 1411a. Here, any one of the filter circuit 108 in FIG. 1, the filter circuit 800 in FIG. 8, the filter circuit 900 in FIG. 9 and the filter circuit 1000 in FIG. 10 can be used for the filter circuit 1408 as appropriate. The filter circuit 1409 allows a desired frequency component of the signal input from the even harmonics mixer 1407 to pass and outputs the desired frequency component to the orthogonal demodulator 1411b. Here, any one of the filter circuit 108 in FIG. 1, the filter circuit 800 in FIG. 8, the filter circuit 900 in FIG. 9 and the filter circuit 1000 in FIG. 10 can be used for the filter circuit 1409 as appropriate. The orthogonal demodulator 1411a orthogonal-demodulates the signal input from the filter circuit 1408 to obtain reception data. The orthogonal demodulator 1411b orthogonal-demodulates the signal input from the filter circuit 1409 to obtain reception data. The phase shifter 1413 generates two waves having a phase difference of 90 degrees from the distributed signal input from the distributor 1402 and outputs the two waves to the orthogonal demodulator 1414a and orthogonal demodulator 1414b. The orthogonal demodulator 1414a orthogonal-demodulates the signal input from the phase shifter 1413 to obtain reception data. The orthogonal demodulator 1414b orthogonal-demodulates the signal input from the phase shifter 1413 to obtain reception data.

The operation of the radio apparatus 1400 configured as shown above will be explained below.

At the output terminals of the even harmonics mixers 1406, 1407, a desired signal component of 2.5×f0 and unnecessary frequency component of 1.5×f0 appear with equal amplitudes. By adopting a low pass type for the filter 106 constituting the filter circuit 108, 800 or 1000, it is possible to extract only a desired frequency component.

The case where any frequency component other than the aforementioned frequency component exists as the unnecessary frequency can be handled using a filter 901, which is the configuration of the filter 106, changed from a low pass type to a band-reject type.

Here, if f0 is assumed to be, for example, a 2 GHz band, an output signal of a 5 GHz band can be extracted from the frequency conversion circuit 1410, and therefore providing a local oscillator of a 2 GHz band makes it possible to realize a receiver applicable to a dual-band of 2 GHz band/5 GHz band. The operations of the filter circuits 1408, 1409 are the same as those in Embodiment 1 to Embodiment 4 and explanations thereof will be omitted.

Thus, in addition to the effects of Embodiment 1 to Embodiment 4, this Embodiment 8 can provide a radio apparatus applicable to a dual-band system with unnecessary frequencies due to local oscillation frequencies reduced.

In this Embodiment 8, the inverted input terminal of the differential amplifier 1405 is grounded and the distributed signal is input to the non-inverted input terminal, but the present invention is not limited to this and can also be adapted so that the polarities of the input terminals of the differential amplifier 1405 are inverted, the non-inverted input terminal is grounded and the distributed signal is input to the inverted input terminal. Furthermore, this Embodiment 8 uses the differential amplifier 1405, but the present invention is not limited to this and using a distributor instead of the differential amplifier 1405 can also obtain the same effect. Furthermore, this Embodiment 8 applies the frequency conversion circuit 1410 to the direct conversion receiver, but the present invention is not limited to this and the same effect can also be obtained by applying the frequency conversion circuit 1410 to a direct conversion transmitter.

As described above, the present invention can maintain the attenuation characteristic or passage characteristic in a high-frequency band using an in-phase elimination effect of a differential amplifier.

This application is based on the Japanese Patent Application No. 2002-319745 filed on Nov. 1, 2002 and the Japanese Patent Application No. 2003-152532 filed on May 29, 2003, entire content of which is expressly incorporated by reference herein.

INDUSTRIAL APPLICABILITY

The present invention is preferably applicable to a high-frequency band filter circuit and radio apparatus used for a digital radio communication system, etc.

[FIG. 1]
104 BUFFER
103 DISTRIBUTOR
105 BUFFER
106 FILTER

[FIG. 2]
POWER
FREQUENCY

[FIG. 3]
POWER
FREQUENCY

[FIG. 4A]
POWER
FREQUENCY

[FIG. 4B]
POWER
FREQUENCY

[FIG. 4C]
POWER
FREQUENCY

[FIG. 5A]
POWER
FREQUENCY

[FIG. 5B]
POWER
FREQUENCY

[FIG. 5C]
POWER
FREQUENCY

[FIG. 6]
POWER
FREQUENCY

[FIG. 7]
POWER
FREQUENCY

[FIG. 8]
104 BUFFER
801 ADJUSTMENT CIRCUIT
103 DISTRIBUTOR
802 COMPARATOR
105 BUFFER
106 FILTER

[FIG. 9]
104 BUFFER
902 ADJUSTMENT CIRCUIT
103 DISTRIBUTOR
802 COMPARATOR
105 BUFFER
903 SELECTOR
BAND SELECTION SIGNAL

[FIG. 10]
1001 DETECTION CIRCUIT
104 BUFFER
103 DISTRIBUTOR
105 BUFFER
106 FILTER

[FIG. 11]
1102 FILTER CIRCUIT
1106 DEMODULATOR
RECEIVED DATA

[FIG. 12]
1202 FILTER CIRCUIT
1201 MODULATOR
IQ SIGNAL
1206 BASEBAND SECTION
TRANSMISSION DATA

[FIG. 13]
1102 FILTER CIRCUIT
1106 DEMODULATOR
RECETION DATA
1302 FILTER CIRCUIT

[FIG. 14]
1403 DISTRIBUTOR
1408 FILTER CIRCUIT
1404 ½ FREQUENCY DIVIDER
1409 FILTER CIRCUIT
1402 DISTRIBUTOR
1413 PHASE SHIFTER

What is claimed is:

1. A filter circuit, comprising:
a distributor that distributes an input signal as two distributed signals;
a filter that filters a first distributed signal of the two distributed signals by passing a predetermined frequency band of the first distributed signal;
a differential amplifier that outputs a difference between amplitude components of the filtered first distributed signal and a second distributed signal of the two distributed signals;
a comparator that compares the filtered first distributed signal and the second distributed signal to detect a voltage difference; and
a calibration circuit that performs at least one of applying a phase rotation to the second distributed signal which is equivalent to a phase rotation of the filtered first distributed signal, and applying an amplitude attenuation to the second distributed signal which is equivalent to an amplitude attenuation of the filtered first distributed signal.

2. The filter circuit according to claim 1, further comprising a buffer that suppresses interference between the two distributed signals distributed by said distributor, the buffer outputting the second distributed signal to the differential amplifier.

3. The filter circuit according to claim 1, further comprising:
a reference signal source that generates a reference signal for adjusting at least one of the phase rotation and the amplitude attenuation of the second distributed signal by said calibration circuit; and
a switch that connects the reference signal to the distributor while the calibration circuit performs at least one of a phase rotation adjustment and an amplitude attenuation adjustment, and connects the input signal to the distributor after the calibration circuit completes the at least one of the phase rotation adjustment and the amplitude attenuation adjustment,
wherein said distributor distributes said reference signal as two signals while said calibration circuit adjusts performs at least one of the phase rotation adjustment and the amplitude attenuation adjustment and distributes said input signal as the two signals after the calibration circuit completes the at least one of the phase rotation adjustment and the amplitude attenuation adjustment.

4. A filter circuit, comprising:
a distributor that distributes an input signal as two distributed signals;
a filter that filters a first distributed signal of the two distributed signals by passing a predetermined frequency band of the first distributed signal;
a calibration circuit that performs at least one of applying a phase rotation to a second distributed signal of the two distributed signals which is equivalent to a phase rotation of the filtered first distributed signal, and applying an amplitude attenuation to the second distributed signal which is equivalent to an amplitude attenuation of the filtered first distributed signal;
a differential amplifier that outputs a difference between amplitude components of the filtered first distributed signal and the second distributed signal to which at least one of a phase rotation and an amplitude attenuation is applied; and
a comparator that compares a voltage at a midpoint of a transmission path between the calibration circuit and the differential amplifier, and a voltage at a midpoint of a transmission path between the filter and the differential amplifier to detect a voltage difference,
wherein said calibration circuit performs at least one of applying a phase rotation to the second distributed signal, and applying an amplitude attenuation to the second distributed signal until the voltage difference detected by the comparator becomes less than a predetermined value.

5. The filter circuit according to claim 1, wherein said filter filters the first distributed signal by preventing passage of frequencies outside the predetermined frequency band of the first distributed signal.

6. The filter circuit according to claim 1, wherein the filter filters the first distributed signal by preventing passage of frequencies outside the predetermined frequency band of the first distributed signal, the filter is capable of changing the predetermined frequency band, and
when the filter changes the predetermined frequency band, the calibration circuit performs at least one of applying a phase rotation to the second distributed signal which is equivalent to a phase rotation of the filtered first distributed signal, and applying an amplitude attenuation to the second distributed signal which is equivalent to an amplitude attenuation of the filtered first distributed signal, in accordance with the change of the predetermined frequency band.

7. The filter circuit according to claim 1, wherein the phase rotation applied by the calibration circuit to the second distributed signal is variable.

8. A filter circuit, comprising:
a distributor that distributes an input signal as two distributed signals;
a filter that filters a first distributed signal of the two distributed signals by passing a predetermined frequency band of the first distributed signal;
a differential amplifier that outputs a difference between amplitude components of the filtered first distributed signal and a second distributed signal of the two distributed signals;
a detection circuit that detects a frequency component other than a desired frequency component; and
a switch that performs switching so as to select a transmission path in which an input signal is input to said differential amplifier through said distributor when said detection circuit detects a frequency component other than a desired frequency component, and select a transmission path in which the input signal is input to said differential amplifier without passing through said distributor when said detection circuit detects only a desired frequency component,
wherein said differential amplifier outputs said input signal as is when said detection circuit detects only a desired frequency component, and outputs a difference between amplitude components of the filtered first distributed signal and the second distributed signal when said detection circuit detects any frequency component other than a desired frequency component.

9. The filter circuit according to claim 8, wherein said differential amplifier adds a gain to the difference between amplitude components of the filtered first distributed signal and the second distributed signal to compensate for an attenuation caused by said distributor when said detection circuit detects a frequency component other than a desired frequency component.

10. A radio apparatus comprising a filter circuit, said filter circuit comprising:
a distributor that distributes an input signal into two lines of distributed signals;
a filter that filters a first distributed signal of the two distributed signals by passing a predetermined frequency band of the first distributed signal;
a differential amplifier that outputs a difference between amplitude components of the filtered first distributed signal and a second distributed signal of the two distributed signal;
a comparator that compares the filtered first distributed signal and the second distributed signal to detect a voltage difference; and
a calibration circuit that performs at least one of applying a phase rotation to the second distributed signal which is equivalent to a phase rotation of the filtered first distributed signal, and applying an amplitude attenuation to the second distributed signal which is equivalent to an amplitude attenuation of the filtered first distributed signal.

11. A method of selecting an output signal, comprising:
distributing an input signal as two distributed signals;
filtering a first distributed signal of the two distributed signals by passing a predetermined frequency band of the first distributed signal;
outputting a difference between amplitude components of the filtered first distributed signal and a second distributed signal of the two distributed signals
comparing the filtered first distributed signal and the second distributed signal to detect a voltage difference; and
performing at least one of applying a phase rotation to the second distributed signal which is equivalent to a phase rotation of the filtered first distributed signal, and applying an amplitude attenuation to the second distributed signal which is equivalent to an amplitude attenuation of the filtered first distributed signal.

12. The filter circuit according to claim 1, wherein the comparator compares a voltage at a midpoint of a transmission path between the calibration circuit and the differential amplifier, and a voltage at a midpoint of a transmission path between the filter and the differential amplifier to detect a voltage difference.

* * * * *